(12) United States Patent
Ji et al.

(10) Patent No.: US 12,349,455 B2
(45) Date of Patent: Jul. 1, 2025

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Dengfeng Ji, Shanghai (CN); Yi Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 829 days.

(21) Appl. No.: 17/584,883

(22) Filed: Jan. 26, 2022

(65) Prior Publication Data
US 2022/0238517 A1    Jul. 28, 2022

(30) Foreign Application Priority Data
Jan. 26, 2021    (CN) .......................... 202110107070.7

(51) Int. Cl.
| | | |
|---|---|---|
| *H10D 30/62* | (2025.01) | |
| *H01L 21/321* | (2006.01) | |
| *H10D 64/01* | (2025.01) | |
| *H10D 64/23* | (2025.01) | |
| *H10D 64/27* | (2025.01) | |
| *H10D 84/01* | (2025.01) | |
| *H10D 84/03* | (2025.01) | |
| *H10D 84/83* | (2025.01) | |

(52) U.S. Cl.
CPC ....... *H10D 84/834* (2025.01); *H01L 21/3212* (2013.01); *H10D 64/017* (2025.01); *H10D 64/258* (2025.01); *H10D 64/518* (2025.01); *H10D 84/013* (2025.01); *H10D 84/0142* (2025.01); *H10D 84/0158* (2025.01); *H10D 84/038* (2025.01)

(58) Field of Classification Search
None
See application file for complete search history.

(56) References Cited

U.S. PATENT DOCUMENTS

2021/0272893 A1*    9/2021    Song ................. H01L 21/76802

* cited by examiner

*Primary Examiner* — Steven B Gauthier
*Assistant Examiner* — Lamont B Koo
(74) *Attorney, Agent, or Firm* — Anova Law Group, PLLC

(57) ABSTRACT

A semiconductor structure and a fabrication method of the semiconductor structure are provided. The semiconductor structure includes a substrate including a first region and a second region, first gate structures, second gate structures, first source-drain doped layers, second source-drain doped layers, and a first dielectric layer. A top surface of the first dielectric layer disposed over the first region is lower than a top surface of the first dielectric layer disposed over the second region. The semiconductor structure also includes a first barrier layer disposed over the first dielectric layer disposed over the first region. The first barrier layer and the first dielectric layer disposed over the first region include a first opening exposing the first source-drain doped layer, and the first dielectric layer disposed over the second region includes a second opening exposing the second source-drain doped layer.

20 Claims, 6 Drawing Sheets

SEMICONDUCTOR STRUCTURE AND FABRICATION METHOD THEREOF

CROSS-REFERENCES TO RELATED APPLICATIONS

This application claims the priority of Chinese patent application No. 202110107070.7, filed on Jan. 26, 2021, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

With the increase in the integration degree of semiconductor device, a critical size of a transistor continues to shrink. The shrinking of the critical size means that a larger number of transistors can be disposed on a chip, thereby improving the performance of the device. However, as the device area continues to shrink, problems also arise. As the size of the transistor decreases sharply, a thickness and an operating voltage of the gate dielectric layer cannot be changed accordingly, which makes it more difficult to suppress the short-channel effect, such that a channel leakage current of the transistor increases.

As a metal-oxide semiconductor (MOS) transistor shrinks, the gate becomes shorter, and the current channel under the gate also becomes shorter. When the channel of the MOS transistor is shortened to a certain extent, the short-channel effect will appear. Theoretically, a channel length is a distance from a front of the source to a front of the drain. However, the effective length of the channel is affected by a junction depletion region formed between the substrate and each of the source and drain. When the channel length is equal to or shorter than the depth of the junction depletion region, the junction depletion region will obviously merge into the current channel and cause a decrease in a gate threshold voltage, which is referred to the short-channel effect.

To reduce the short-channel effect of the semiconductor device, a long-channel gate structure is introduced, in other words, a width of the gate structure along an extension direction of the fin is increased.

However, when the long-channel gate structure and a short-channel gate structure coexist in an existing semiconductor structure, other problems may also occur, which reduces the performance of the ultimately formed semiconductor structure. The disclosed methods and device structures are directed to solve one or more problems set forth above and other problems.

BRIEF SUMMARY OF THE DISCLOSURE

One aspect of the present disclosure includes a semiconductor structure. The semiconductor structure includes a substrate, and the substrate includes a first region and a second region. The first region includes a plurality of separated first fins, the second region includes a plurality of separated second fins, and each first fin and each second fin are extended along a first direction, respectively. The semiconductor structure also includes a plurality of first gate structures, a plurality of second gate structures, a plurality of first source-drain doped layers, a plurality of second source-drain doped layers, and a first dielectric layer. A first gate structure of the plurality of first gate structures is across a first fin of the plurality of first fins, and adjacent first gate structures of the plurality of first gate structures are spaced apart by a first dimension along the first direction. A second gate structure of the plurality of second gate structures is across a second fin of the plurality of second fins, and adjacent second gate structures of the plurality of second gate structures are spaced apart by a second dimension along the first direction, where the second dimension is smaller than the first dimension. A first source-drain doped layer of the plurality of first source-drain doped layers is located in the first fin on each side of the first gate structure, and a second source-drain doped layer of the plurality of second source-drain doped layers is located in the second fin on each side of the second gate structure. A thickness of the second source-drain doped layer is greater than a thickness of the first source-drain doped layer. The first dielectric layer covers a sidewall of each of the first gate structure and the second gate structure, and a top surface of a first portion of the first dielectric layer disposed over the first region is lower than a top surface of a second portion of the first dielectric layer disposed over the second region. Further, the semiconductor structure includes a first barrier layer disposed over the first portion of the first dielectric layer disposed over the first region. The first barrier layer and the first portion of the first dielectric layer disposed over the first region include a first opening, and the first opening exposes the first source-drain doped layer. The second portion of the first dielectric layer disposed over the second region includes a second opening, and the second opening exposes the second source-drain doped layer.

Optionally, the semiconductor structure further includes a second barrier layer disposed over the first gate structure, the second gate structure, the first dielectric layer, and the first barrier layer, and a second dielectric layer disposed over the second barrier layer. The first opening and the second opening are further located in the second barrier layer and in the second dielectric layer.

Optionally, the first barrier layer is made of a material including silicon nitride, and the second barrier layer is made of a material including silicon nitride.

Optionally, the first gate structure has a third dimension along the first direction, and the second gate structure has a fourth dimension along the first direction, where the fourth dimension is smaller than the third dimension.

Optionally, the semiconductor structure further includes a conductive layer disposed in each of the first opening and the second opening.

Optionally, the conductive layer is made of a material including a metal, and the metal includes cobalt, rubidium, tungsten, aluminum, copper, titanium, silver, gold, lead, or nickel.

Another aspect of the present disclosure includes a fabrication method of a semiconductor structure. The method includes providing a substrate. The substrate includes a first region and a second region. The first region includes a plurality of separated first fins, the second region includes a plurality of separated second fins, and each first fin and each second fin are extended along a first direction, respectively. The method also includes forming a plurality of first gate structures, a plurality of second gate structures, a plurality of first source-drain doped layers, a plurality of second source-drain doped layers, and a first dielectric layer. A first gate structure of the plurality of first gate structures is across a first fin of the plurality of first fins, and adjacent first gate structures of the plurality of first gate structures are spaced apart by a first dimension along the first direction. A second gate structure of the plurality of second gate structures is across a second fin of the plurality of second fins, and adjacent second gate structures of the plurality of second gate structures are spaced apart by a second dimension along the first direction, where the second dimension is smaller than the first dimension. A first source-drain doped layer of the plurality of first source-drain doped layers is located in the first fin on each side of the first gate structure, and a second source-drain doped layer of the plurality of second source-drain doped layers is located in the second fin on each side of the second gate structure. A thickness of the second source-drain doped layer is greater than a thickness of the first source-drain doped layer. The first dielectric layer covers a sidewall of each of the first gate structure and the second gate structure, and a top surface of a first portion of the first dielectric layer disposed over the first region is lower than a top surface of a second portion of the first dielectric layer disposed over the second region. Moreover, the method includes forming a first barrier layer on a surface of the first portion of the first dielectric layer disposed over the first region. Further, the method includes forming a first opening in the first barrier layer and in the first portion of the first dielectric layer disposed over the first region by removing a portion of the first barrier layer and a portion of the first portion of the first dielectric layer through etching, and forming a second opening in the second portion of the first dielectric layer disposed over the second region by removing a portion of the second portion of the first dielectric layer through etching. The first opening exposes the first source-drain doped layer, and the second opening exposes the second source-drain doped layer. An etching rate of the first barrier layer is less than an etching rate of the first dielectric layer.

Optionally, before forming the plurality of first gate structures and the plurality of second gate structures, the method further includes forming a plurality of first dummy gate structures over the first region, where a first dummy gate structure of the plurality of first dummy gate structures is across the first fin; and forming a plurality of second dummy gate structures over the second region, where a second dummy gate structure of the plurality of second dummy gate structures is across the second fin. The first dielectric layer covers a sidewall of each of the first dummy gate structure and the second dummy gate structure.

Optionally, forming the plurality of first source-drain doped layers and the plurality of second source-drain doped layers includes: forming a plurality of first source-drain openings in the first fin by etching the first fin using the plurality of first dummy gate structures as a mask; forming a plurality of second source-drain openings in the second fin by etching the second fin using the plurality of second dummy gate structures as a mask; simultaneously forming an epitaxial layer in each first source-drain opening and each second source-drain opening using an epitaxial growth process until the epitaxial layer fully fills a second source-drain opening of the plurality of second source-drain openings; and in-situ doping the epitaxial layer during the epitaxial growth process, to dope source-drain ions in the epitaxial layer, to form the first source-drain doped layer and the second source-drain doped layer.

Optionally, forming the plurality of first gate structures and the plurality of second gate structures includes: removing the first dummy gate structure to form a first gate opening in the first dielectric layer; removing the second dummy gate structure to form a second gate opening in the first dielectric layer; forming the first gate structure in the first gate opening; and forming the second gate structure in the second gate opening.

Optionally, forming the first gate structure in the first gate opening and forming the second gate structure in the second gate opening include: forming a gate material layer in the first gate opening, in the second gate opening, and on a top surface of the first dielectric layer; and performing a planarization treatment on the gate material layer and the first dielectric layer, to form the first gate structure and the second gate structure.

Optionally, the planarization treatment includes a chemical mechanical polishing process.

Optionally, the chemical mechanical polishing process includes: performing a first chemical mechanical polishing process on the gate material layer until the top surface of the first dielectric layer is exposed, where a polishing rate of the first chemical mechanical polishing process on the gate material layer is greater than a polishing rate of the first chemical mechanical polishing process on the first dielectric layer; and after performing the first chemical mechanical polishing process, performing a second chemical mechanical polishing process on the gate material layer and the first dielectric layer until each of the first gate structure and the second gate structure has a preset height, where a polishing rate of the second chemical mechanical polishing process on the first dielectric layer is greater than a polishing rate of the second chemical mechanical polishing process on the gate material layer.

Optionally, a ratio of the polishing rate of the first chemical mechanical polishing process on the gate material layer over the polishing rate of the first chemical mechanical polishing process on the first dielectric layer is greater than 10:1. A ratio of the polishing rate of the second chemical mechanical polishing process on the first dielectric layer over the polishing rate of the second chemical mechanical polishing process on the gate material layer is greater than 1:1 and less than or equal to 10:1.

Optionally, during the process of forming the first barrier layer on the surface of the first portion of the first dielectric layer disposed over the first region, the first barrier layer is further formed on a surface of the second portion of the first dielectric layer disposed over the second region. A thickness of the first barrier layer disposed over the first region is greater than a thickness of the first barrier layer disposed over the second region.

Optionally, after forming the first barrier layer, the method further includes: forming a second barrier layer over the first gate structure, the second gate structure, the first dielectric layer, and the first barrier layer; and forming a second dielectric layer over the second barrier layer. The first opening and the second opening are further located in the second barrier layer and in the second dielectric layer.

Optionally, the first barrier layer is made of a material including silicon nitride, and the second barrier layer is made of a material including silicon nitride.

Optionally, the first gate structure has a third dimension along the first direction, and the second gate structure has a fourth dimension along the first direction, where the fourth dimension is smaller than the third dimension.

Optionally, after forming the first opening and the second opening, the method further includes forming a conductive layer in each of the first opening and the second opening.

Optionally, the conductive layer is made of a material including a metal, and the metal includes cobalt, rubidium, tungsten, aluminum, copper, titanium, silver, gold, lead, or nickel.

The disclosed embodiments may have following beneficial effects. In the disclosed semiconductor structure, the first barrier layer may be formed over the first portion of the first dielectric layer disposed over the first region. Because the etching rate of the first barrier layer is lower than the etching rate of the first dielectric layer, during the process of forming the first opening, a certain amount of etching time period may be consumed by the first barrier layer. Therefore, the time period for ultimately etching the first source-drain doped layer may be reduced, such that the first source-drain doped layer may be prevented from being penetrated through by the etching, and the contact resistance between the subsequently formed conductive layer and the first source-drain doped layer may be prevented from increasing, thereby improving the performance of the ultimately formed semiconductor structure.

In the disclosed fabrication method, the first barrier layer may be formed over the first portion of the first dielectric layer disposed over the first region. Because the etching rate of the first barrier layer is lower than the etching rate of the first dielectric layer, during the process of forming the first opening, a certain amount of etching time period may be consumed by the first barrier layer. Therefore, the time period for ultimately etching the first source-drain doped layer may be reduced, such that the first source-drain doped layer may be prevented from being penetrated through by the etching, and the contact resistance between the subsequently formed conductive layer and the first source-drain doped layer may be prevented from increasing, thereby improving the performance of the ultimately formed semiconductor structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
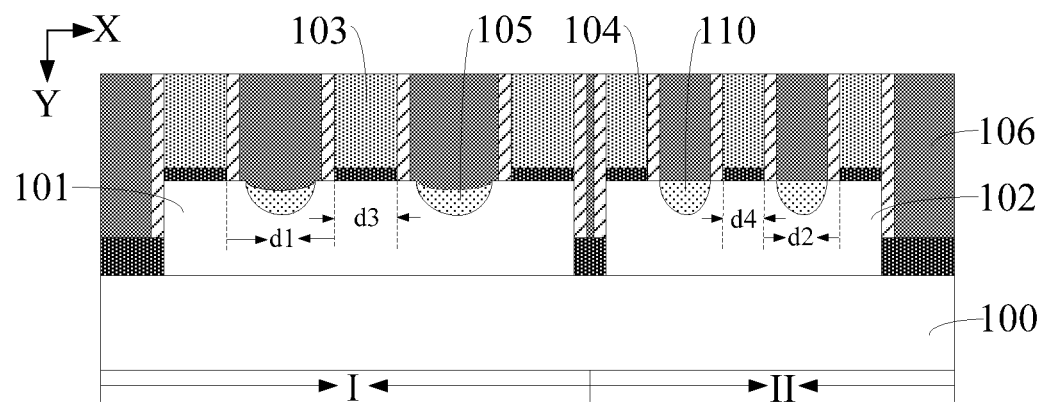
FIGS. 1-2 illustrate semiconductor structures corresponding to certain stages for forming a semiconductor structure.
Figure 2:
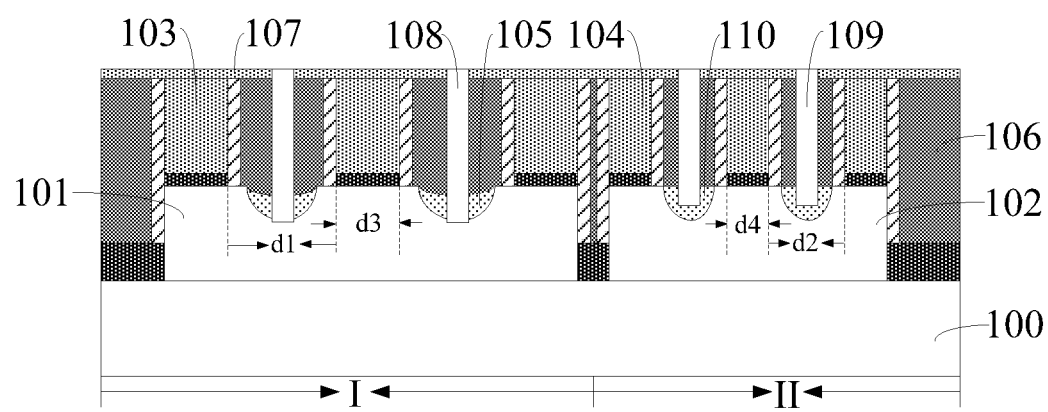

When a long-channel gate structure and a short-channel gate structure coexist in a semiconductor structure, other problems may also occur, which reduces the performance of the ultimately formed semiconductor structure. FIGS. 1-2 illustrate semiconductor structures corresponding to certain stages for forming the semiconductor structure.

Referring to FIG. 1, a substrate 100 is provided. The substrate 100 includes a first region I and a second region II. A plurality of separated first fins 101 are formed over the first region I, and a plurality of separate second fins 102 are formed over the second region II. Each first fin 101 and each second fin 102 are extended along a first direction X. A plurality of first gate structures 103, a plurality of second gate structures 104, a plurality of first source-drain doped layers 105, a plurality of second source-drain doped layers 110, and a first dielectric layer 106 are formed. Each first gate structure 103 is across the first fin 101. Adjacent first gate structures 103 are spaced apart by a first dimension d1 along the first direction X, and the first gate structure 103 has a third dimension d3 along the first direction X. Each second gate structure 104 is across the second fin 102. Adjacent second gate structures 104 are spaced apart by a second dimension d2 along the first direction X, and the second gate structures 104 has a fourth dimension d4 along the first direction X. The first dimension d1 is greater than the second dimension d2, and the third dimension d3 is greater than the fourth dimension d4. The first source-drain doped layer 105 is disposed in the first fin 101 on each side of the first gate structure 103, and the second source-drain doped layer 110 is disposed in the second fin 102 on each side of the second gate structure 104. A thickness of the second source-drain doped layer 110 is greater than a thickness of the first source-drain doped layer 105. The first dielectric layer 106 covers the sidewalls of each of the first gate structure 103 and the second gate structure 104.

Referring to FIG. 2, a first barrier layer 107 is formed on the first dielectric layer 106. A portion of the first dielectric layer 106 and a portion of the first barrier layer 107 are removed by etching, to form a first opening in the first dielectric layer 106 and the first barrier layer 107 disposed over the first region I, and to form a second opening in the first dielectric layer 106 and the first barrier layer 107 disposed over the second region II. The first opening exposes the first source-drain doped layer 105 disposed over the first region I, and the second opening exposes the second source-drain doped layer 110 disposed over the second region II. A first conductive structure 108 is formed in the first opening, and a second conductive structure 109 is formed in the second opening.

In one embodiment, by increasing the third dimension d3 of the first gate structure 103 along the first direction X, where the third dimension d3 is greater than 50 nm, the length of the channel increases.

However, when the third dimension d3 of the first gate structure 103 and the first dimension d1 between the adjacent first gate structures 103 along the first direction X increase, the size of the first fin 101 exposed on each side of the first gate structure 103 also increases. When the size of the exposed first fin 101 increases, the size of the subsequently formed first source-drain opening (not marked) along the first direction X also increases. The first source-drain doped layer 105 is formed by epitaxial growth attached to the first fin 101 exposed by the first source-drain opening. When the size of the first source-drain opening is substantially large along the first direction X, and when the second source-drain doped layer 110 fully fills a second source-drain opening, the first source-drain doped layer 105 located in the first source-drain opening has a substantially small volume along a second direction Y, where the second direction Y is perpendicular to the first direction X. Therefore, the first source-drain doped layer 105 located in the first source-drain opening is recessed in a middle position, thereby making the thickness of the second source-drain doped layer 110 be greater than the thickness of the first source-drain doped layer 105.

When the source-drain doped layer 105 located in the first source-drain opening is recessed in the middle position, in the process of forming the first conductive structure 108, the first source-drain doped layer 105 tends to be penetrated through by etching, such that the bottom surface of the ultimately formed first conductive structure 108 is in contact with the first fin 101, and a contact resistance between the first conductive structure 108 and the first source-drain doped layer 105 increases, thereby affecting the performance of the ultimately formed semiconductor structure. If the etching time period is reduced to avoid penetrating through the first source-drain doped layer 105 by etching, an etching depth of the second opening is not enough to expose the second source-drain doped layer 110, such that the second conductive structure 109 is not capable of being in contact with the second source-drain doped layer 110, thereby affecting the performance of the ultimately formed semiconductor structure.

The present disclosure provides a semiconductor structure and a fabrication method thereof. A first barrier layer may be formed on a surface of a first dielectric layer disposed over a first region. Because an etching rate of the first barrier layer is lower than an etching rate of the first dielectric layer, in the process of forming the first opening, a certain amount of etching time period may be consumed by the first barrier layer. Therefore, the time period for ultimately etching the first source-drain doped layer may be reduced, and the first source-drain doped layer may be prevented from being penetrated through by the etching to increase a contact resistance between a subsequently formed conductive layer and the first source-drain doped layer, thereby improving the performance of the ultimately formed semiconductor structure.

Figure 11:
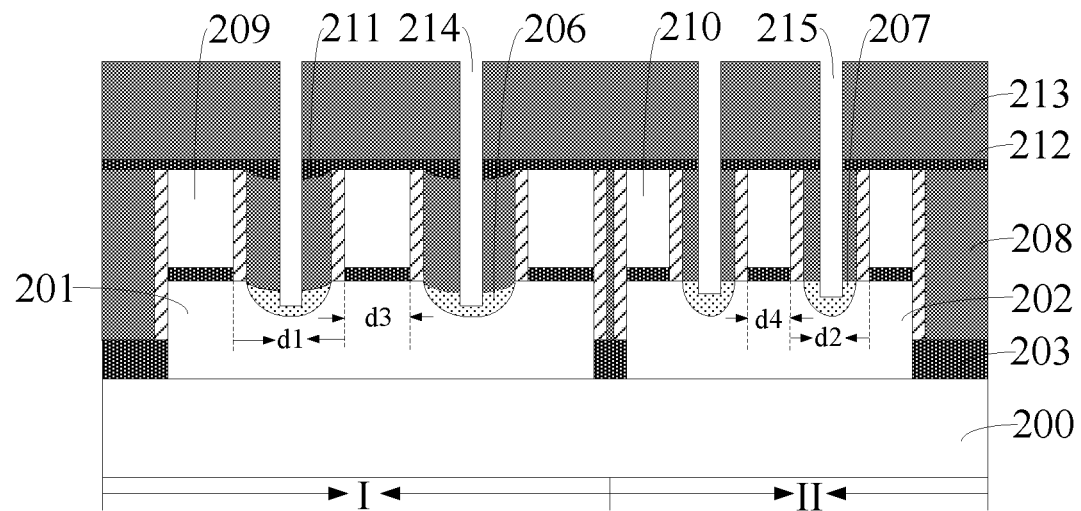
Figure 12:
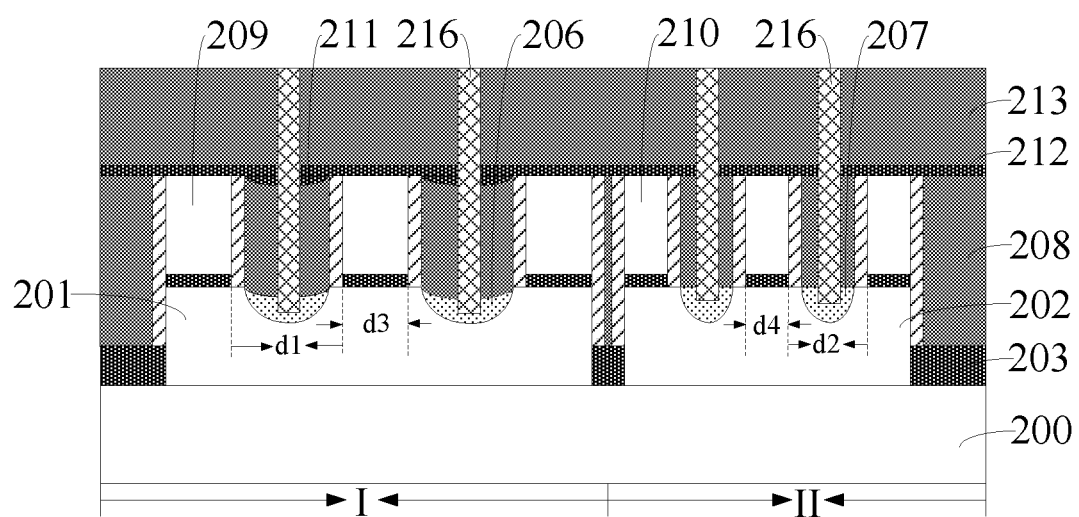
Figure 13:
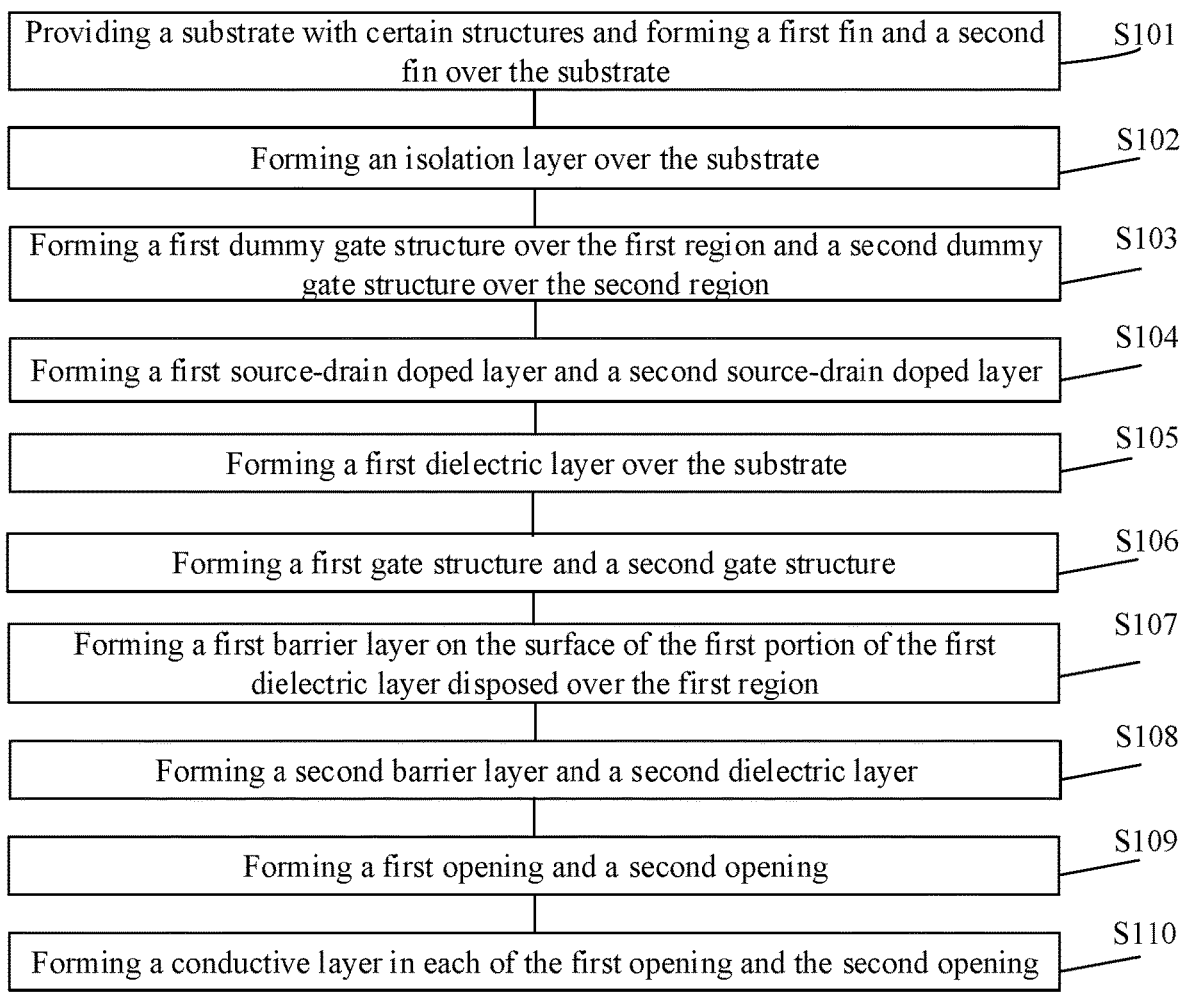
FIG. 13 illustrates a flowchart of an exemplary method for forming a semiconductor structure consistent with various disclosed embodiments of the present disclosure.

FIG. 13 illustrates a flowchart of a method for forming a semiconductor structure consistent with various disclosed embodiments of the present disclosure, and FIGS. 3-12 illustrate semiconductor structures corresponding to certain stages of the fabrication method.

Figure 3:
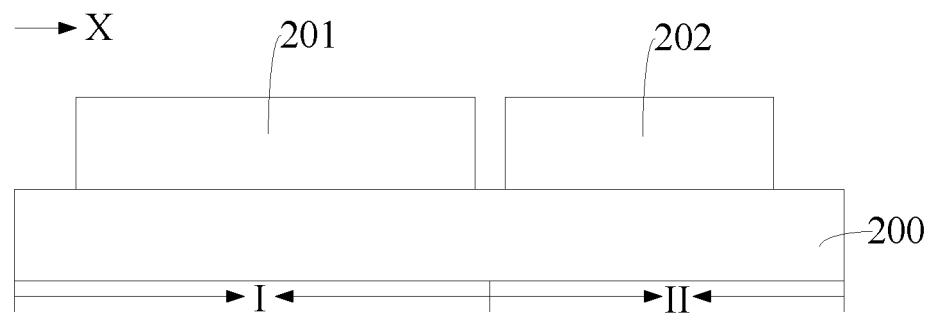
FIGS. 3-12 illustrate semiconductor structures corresponding to certain stages for forming an exemplary semiconductor structure consistent with various disclosed embodiments of the present disclosure.

As shown in FIG. 13, at the beginning of the fabrication method, a substrate with certain structures may be provided and a first fin and a second fin may be formed over the substrate (S101). FIG. 3 illustrates a corresponding semiconductor structure.

Referring to FIG. 3, a substrate 200 may be provided. The substrate 200 may include a first region I and a second region II. The first region I may include a plurality of separated first fins 201, and the second region II may include a plurality of separated second fins 202. Each first fin 201 and each second fin 202 may be extended along a first direction X, respectively.

In one embodiment, forming the substrate 200, the first fin 201, and the second fin 202 may include: providing an initial substrate (not shown); forming a patterned layer on the initial substrate (not shown), where the patterned layer may expose a portion of a top surface of the initial substrate; and using the patterned layer as a mask to etch the initial substrate, to form the substrate 200, the first fin 201, and the second fin 202.

In one embodiment, the substrate 200 may be made of silicon. In another embodiment, the substrate may be made of germanium, silicon germanium, silicon carbide, gallium arsenide, or indium gallium.

In one embodiment, both the first fin 201 and the second fin 202 may be made of silicon. In another embodiment, both the first fin and the second fin may be made of germanium, silicon germanium, silicon carbide, gallium arsenide or indium gallium.

Figure 4:
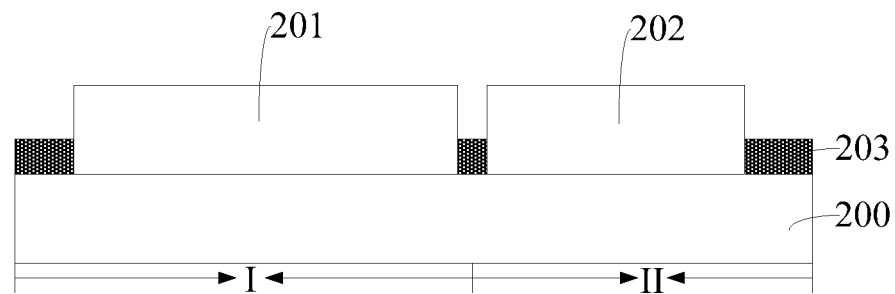

Returning to FIG. 13, after forming the first fin and the second fin, an isolation layer may be formed over the substrate (S102). FIG. 4 illustrates a corresponding semiconductor structure.

Referring to FIG. 4, an isolation layer 203 may be formed over the substrate 200. The isolation layer 203 may cover a portion of a sidewall of each of the first fin 201 and the second fin 202, and a top surface of the isolation layer 203 may be lower than a top surface of each of the first fin 201 and the second fin 202.

In one embodiment, forming the isolation layer 203 may include: forming an initial isolation layer (not shown) over the substrate 200; and removing a portion of the initial isolation layer by etching to form the isolation layer 203. The top surface of the isolation layer 203 may be lower than the top surface of each of the first fin 201 and the second fin 202.

The isolation layer 203 may be made of an insulating material. The insulating material may include silicon oxide or silicon oxy-nitride. In one embodiment, the isolation layer 203 may be made of silicon oxide.

After forming the isolation layer 203, the method may further include: forming a plurality of first gate structures, a plurality of second gate structures, a plurality of first source-drain doped layers, a plurality of second source-drain doped layers, and a first dielectric layer. Each first gate structure may be across the first fin 201, and adjacent first gate structures may be spaced apart by a first dimension along the first direction X. Each second gate structure may be across the second fin 202, and adjacent second gate structures may be spaced apart by a second dimension along the first direction X. The second dimension may be smaller than the first dimension. The first source-drain doped layer may be located in the first fin 201 on each side of the first gate structure, and the second source-drain doped layer may be located in the second fin 202 on each side of the second gate structure. A thickness of the second source-drain doped layer may be greater than a thickness of the first source-drain doped layer. The first dielectric layer may cover a sidewall of each of the first gate structure and the second gate structure. A top surface of a first portion of the first dielectric layer disposed over the first region I may be lower than a top surface of a second portion of the first dielectric layer disposed over the second region II. Detailed formation processes may refer to FIGS. 5-8.

Figure 5:
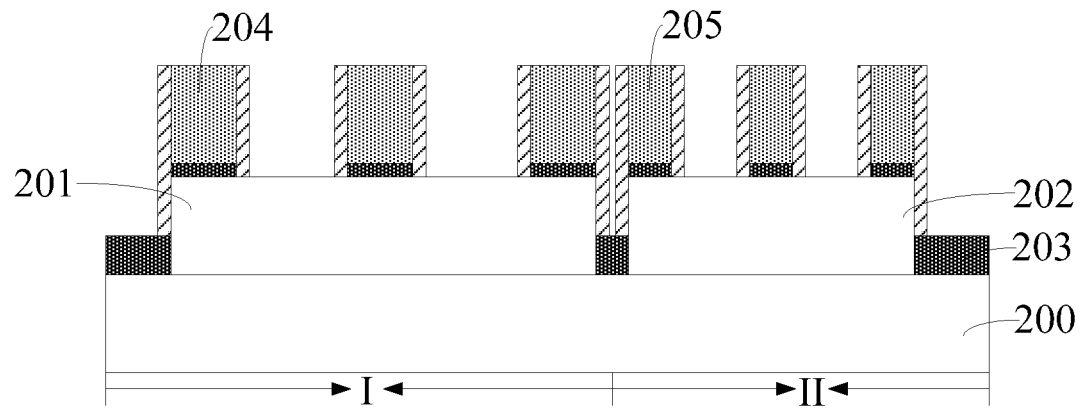

Returning to FIG. 13, after forming the isolation layer, a first dummy gate structure and a second dummy gate structure may be formed (S103). FIG. 5 illustrates a corresponding semiconductor structure.

Referring to FIG. 5, a plurality of first dummy gate structures 204 may be formed over the first region I. Each first dummy gate structure 204 may be across the first fin 201. A plurality of second dummy gate structures 205 may be formed over the second region II. Each second dummy gate structure 205 may be across the second fin 202.

In one embodiment, the first dummy gate structure 204 and the second dummy gate structure 205 may be simultaneously formed using a same photomask. Through forming the first dummy gate structure 204 and the second dummy gate structure 205 by a global process, the production efficiency may be effectively improved.

In one embodiment, each of the first dummy gate structure 204 and the second dummy gate structure 205 may include a dummy gate dielectric layer, and a dummy gate layer (not labeled) disposed over the dummy gate dielectric layer.

In one embodiment, the dummy gate dielectric layer may be made of silicon oxide. In another embodiment, the dummy gate dielectric layer may be made of silicon oxy-nitride. In one embodiment, the dummy gate layer may be made of polysilicon.

In one embodiment, referring to FIG. 5, after forming the first dummy gate structure 204 and the second dummy gate structure 205, the method may further include: forming a first sidewall spacer (not labeled) on a sidewall of the first dummy gate structure 204, and forming a second sidewall spacer (not labeled) on a sidewall of the second dummy gate structure 205.

In one embodiment, forming the first sidewall spacer and the second sidewall spacer may include: forming a sidewall spacer material layer (not shown) on the sidewall and top surfaces of each of the first dummy gate structure 204 and the second dummy gate structure 205, and on the top surface of the isolation layer 203; and back-etching the sidewall spacer material layer until the top surface of each of the first dummy gate structure 204, the second dummy gate structure 205, and the isolation layer 203 is exposed, to form the first sidewall spacer and the second sidewall spacer.

In one embodiment, forming the sidewall spacer material layer may include an atomic layer deposition process. In another embodiment, each of the first sidewall spacer and the second sidewall spacer may be made of silicon nitride.

Figure 6:
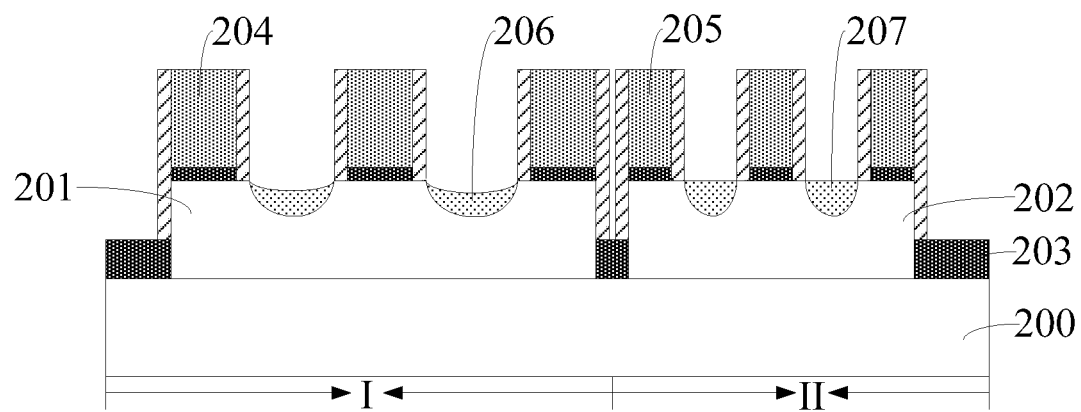

Returning to FIG. 13, after forming the first dummy gate structure and the second dummy gate structure, a first source-drain doped layer and a second source-drain doped layer may be formed (S104). FIG. 6 illustrates a corresponding semiconductor structure.

Referring to FIG. 6, the first fin 201 and the second fin 202 may be etched using the first dummy gate structure 204 and the second dummy gate structure 205 as a mask, to form a plurality of first source-drain openings (not labeled) in the first fin 201 and a plurality of second source-drain openings (not labeled) in the second fin 202. A first source-drain doped layer 206 may be formed in the first source-drain opening, and a second source-drain doped layer 207 may be formed in the second source-drain opening.

In one embodiment, forming the first source-drain doped layer 206 and the second source-drain doped layer 207 may include: simultaneously forming an epitaxial layer (not shown) in each of the first source-drain opening and the second source-drain opening using an epitaxial growth process, where the epitaxial layer may fully fill the second source-drain opening; and in-situ doping the epitaxial layer during the epitaxial growth process, to dope source-drain ions in the epitaxial layer, to form the first source-drain doped layer 206 and the second source-drain doped layer 207.

In one embodiment, the first region I may be configured to form a long-channel transistor structure, and the second region II may be configured to form a short-channel transistor structure. The first source-drain opening in the long-channel transistor structure may have a size greater than the second source-drain opening in the short-channel transistor structure. Because the first source-drain doped layer 206 and the second source-drain doped layer 207 are simultaneously formed using an epitaxial growth process until the epitaxial layer fully fills the second source-drain opening, the thickness of the ultimately formed second source-drain doped layer 207 may be greater than the thickness of the first source-drain doped layer 206, where a thickness direction may be a direction perpendicular to the surface of the substrate.

Figure 7:
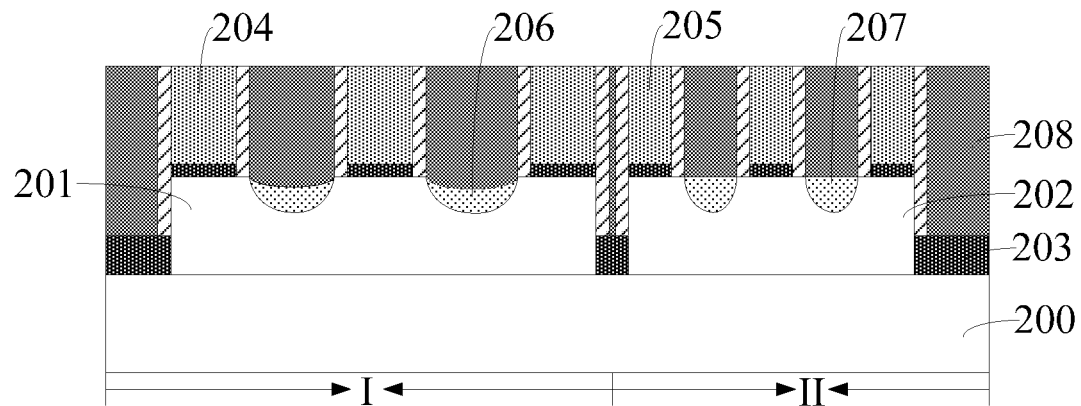

Returning to FIG. 13, after forming the first source-drain doped layer and the second source-drain doped layer, a first dielectric layer may be formed over the substrate (S105). FIG. 7 illustrates a corresponding semiconductor structure.

Referring to FIG. 7, a first dielectric layer 208 may be formed over the substrate 200. The first dielectric layer 208 may cover the sidewall of each of the first dummy gate structure 204 and the second dummy gate structure 205.

In one embodiment, forming the first dielectric layer 208 may include: forming an initial dielectric layer (not shown) over the substrate 200, where the initial dielectric layer may cover the first source-drain doped layer 206, the second source-drain doped layer 207, the first dummy gate structure 204, and the second dummy gate structure 205; and planarizing the initial dielectric layer until the top surface of each of the first dummy gate structure 204 and the second dummy gate structure 205 is exposed, to from the first dielectric layer 208.

In one embodiment, the first dielectric layer 208 may be made of silicon oxide. In another embodiment, the first dielectric layer may be made of a low-K dielectric material (the low-K dielectric material may refer to a dielectric material having a relative dielectric constant lower than 3.9) or an ultra-low-K dielectric material (the ultra-low-K dielectric material may refer to a dielectric material having a relative dielectric constant lower than 2.5).

Figure 8:
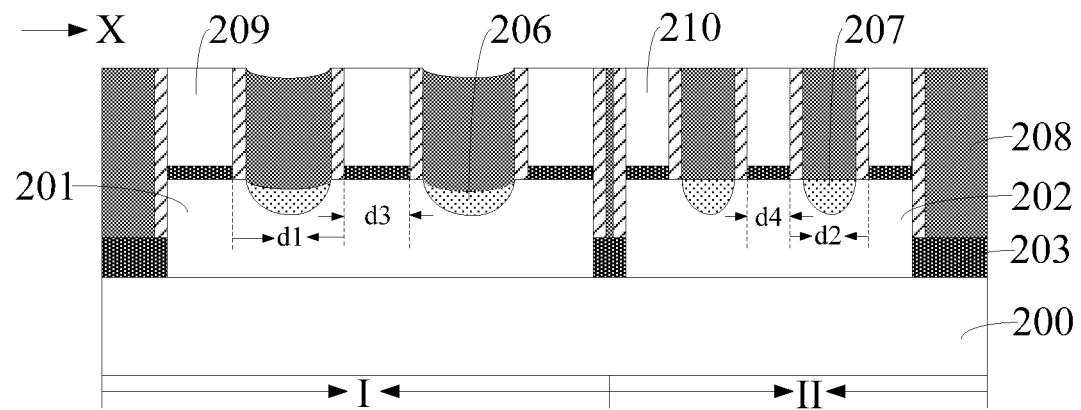

Returning to FIG. 13, after forming the first dielectric layer, a first gate structure and a second gate structure may be formed (S106). FIG. 8 illustrates a corresponding semiconductor structure.

Referring to FIG. 8, the first dummy gate structure 204 may be removed to form a first gate opening (not labeled) in the first dielectric layer 208. The second dummy gate structure 205 may be removed to form a second gate opening (not labeled) in the first dielectric layer 208. The first gate structure 209 may be formed in the first gate opening, and the second gate structure 210 may be formed in the second gate opening.

In one embodiment, the first region I may be configured to form a long-channel transistor structure, and the second region II may be configured to form a short-channel transistor structure. The first gate structure 209 may have a third dimension d3 along the first direction X, and the second gate structure 210 may have a fourth dimension d4 along the first direction X, where the fourth dimension d4 may be smaller than the third dimension d3. Adjacent first gate structures 209 may be spaced apart by a first dimension d1 along the first direction X, and adjacent second gate structures 210 may be spaced apart by a second dimension d2 along the first direction X, where the second dimension d2 may be smaller than the first dimension d1.

In one embodiment, forming the first gate structure 209 in the first gate opening and forming the second gate structure 210 in the second gate opening may include: forming a gate material layer (not shown) in the first gate opening, in the second gate opening, and on the surface of the first dielectric layer 208; and planarizing the gate material layer and the first dielectric layer 208, to form the first gate structure 209 and the second gate structure 210.

In one embodiment, the planarization process may include a chemical mechanical polishing process. The chemical mechanical polishing process may include performing a first chemical mechanical polishing process on the gate material layer until the top surface of the first dielectric layer 208 is exposed. A polishing rate of the first chemical mechanical polishing process on the gate material layer may be greater than a polishing rate of the first chemical mechanical polishing process on the first dielectric layer 208. After performing the first chemical mechanical polishing process, the chemical mechanical polishing process may also include performing a second chemical mechanical polishing process on the gate material layer and the first dielectric layer 208 until each of the first gate structure 209 and the second gate structure 210 has a preset height. A polishing rate of the second chemical mechanical polishing process on the first dielectric layer 208 may be greater than a polishing rate of the second chemical mechanical polishing process on the gate material layer.

In one embodiment, a ratio of the polishing rate of the first chemical mechanical polishing process on the gate material layer over the polishing rate of the first chemical mechanical polishing process on the first dielectric layer may be greater than 10:1. A ratio of the polishing rate of the second chemical mechanical polishing process on the first dielectric layer over the polishing rate of the second chemical mechanical polishing process on the gate material layer may be greater than 1:1 and less than or equal to 10:1.

Because the second dimension d2 is smaller than the first dimension d1, along the first direction X, the size of a first portion of first dielectric layer 208 deposited between the adjacent first gate structures 209 may be greater than the size of a second portion of the first dielectric layer 208 deposited between the adjacent second gate structures 210. Correspondingly, a contact surface of the first portion of the first dielectric layer 208 disposed over the first region I in the chemical mechanical polishing process may be substantially large, and the deformation effect of the first portion of the first dielectric layer 208 disposed over the first region I in the chemical mechanical polishing process may be desired. Therefore, during the chemical mechanical polishing process, the polishing rates of the first dielectric layer 208 and the gate material layer may be adjusted in a targeted manner, such that a top surface of the first portion of the first dielectric layer 208 disposed over the first region I may be lower than a top surface of the second portion of the first dielectric layer 208 disposed over the second region II.

Figure 9:
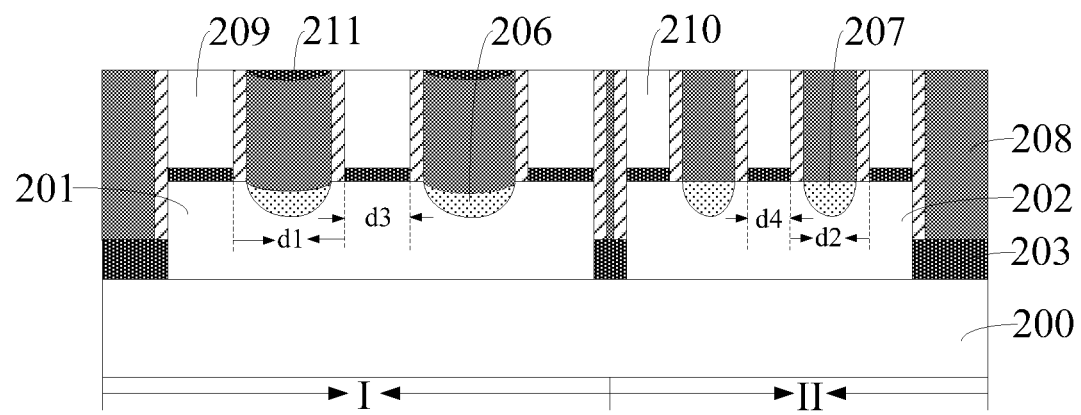

Returning to FIG. 13, after forming the first dielectric layer, a first barrier layer may be formed (S107). FIG. 9 illustrates a corresponding semiconductor structure.

Referring to FIG. 9, a first barrier layer 211 may be formed on the surface of the first portion of the first dielectric layer 208 disposed over the first region I.

In one embodiment, the first barrier layer 211 may merely be formed on the surface of the first portion of the first dielectric layer 208 disposed over the first region I, and the first barrier layer 211 may not be formed on the surface of the second portion of the first dielectric layer 208 disposed over the second region II. In certain embodiments, during the process of forming the first barrier layer on the surface of the first portion of the first dielectric layer disposed over the first region, the first barrier layer may also be formed on the surface of the first dielectric layer disposed over the second region. A thickness of the first barrier layer disposed over the first region may be greater than a thickness of the first barrier layer disposed over the second region.

In one embodiment, forming the first barrier layer 211 may include: forming a barrier material layer (not shown) over the first dielectric layer 208, the first gate structure 209, and the second gate structure 210; and planarizing the barrier material layer until the top surface of each of the first gate structure 209 and the second gate structure 210 is exposed, to form the first barrier layer 211. In one embodiment, the first barrier layer 211 may be made of silicon nitride.

Figure 10:
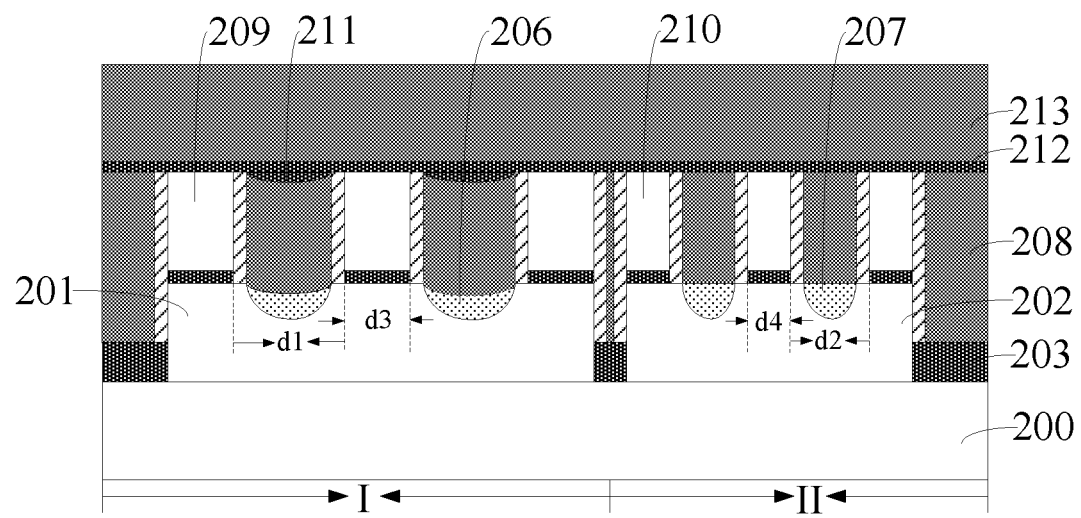

Returning to FIG. 13, after forming the first barrier layer, a second barrier layer and a second dielectric layer may be formed (S108). FIG. 10 illustrates a corresponding semiconductor structure.

Referring to FIG. 10, after forming the first barrier layer 211, a second barrier layer 212 may be formed over the first gate structure 209, the second gate structure 210, the first dielectric layer 208, and the first barrier layer 211, and a second dielectric layer 213 may be formed over the second barrier layer 212.

In one embodiment, the second barrier layer 212 may be made of silicon nitride.

In one embodiment, the second dielectric layer 213 may be made of silicon oxide. In another embodiment, the second dielectric layer may be made of a low-K dielectric material (the low-K dielectric material may refer to a dielectric material having a relative dielectric constant lower than 3.9) or an ultra-low-K dielectric material (the ultra-low-K dielectric material may refer to a dielectric material having a relative dielectric constant lower than 2.5).

Returning to FIG. 13, after forming the second barrier layer and the second dielectric layer, a first opening and a second opening may be formed (S109). FIG. 11 illustrates a corresponding semiconductor structure.

Referring to FIG. 11, a portion of the first portion of the first dielectric layer 208 and the first barrier layer 211 may be etched away, to form a first opening 214 in the first barrier layer 211 and in the first portion of the first dielectric layer 208 disposed over the first region I. The first opening 214 may expose the first source-drain doped layer 206. A portion of the second portion of the first dielectric layer 208 may be etched away, to form a second opening 215 in the second portion of the first dielectric layer 208 disposed over the second region II. The second opening 215 may expose the second source-drain doped layer 207. An etching rate of the first barrier layer 211 may be lower than an etching rate of the first dielectric layer 208.

In one embodiment, the first barrier layer 211 may be formed on the surface of the first portion of the first dielectric layer 208 disposed over the first region I. Because the etching rate of the first barrier layer 211 is lower than the etching rate of the first dielectric layer 208, during the process of forming the first opening 214, a certain amount of etching time period may be consumed by the first barrier layer 211. Therefore, the time period for ultimately etching the first source-drain doped layer 206 may be reduced, such that the first source-drain doped layer 206 may be prevented from being penetrated through by the etching, and the contact resistance between a subsequently formed conductive layer and the first source-drain doped layer 206 may be prevented from increasing, thereby improving the performance of the ultimately formed semiconductor structure.

In one embodiment, the first opening 214 and the second opening 215 may also be located in the second barrier layer 212 and the second dielectric layer 213.

Returning to FIG. 13, after forming the first opening and the second opening, a conductive layer may be formed in each of the first opening and the second opening (S110). FIG. 12 illustrates a corresponding semiconductor structure.

Referring to FIG. 12, a conductive layer 216 may be formed in each of the first opening 214 and the second opening 215.

In one embodiment, forming the conductive layer 216 may include: forming a conductive material layer (not shown) in the first opening 214, in the second opening 215, and on the surface of the second dielectric layer 213; and planarizing the conductive material layer until the top surface of the second dielectric layer 213 is exposed, to form the conductive layer 216.

The conductive layer 216 may be made of a material including a metal, and the metal may include cobalt, rubidium, tungsten, aluminum, copper, titanium, silver, gold, lead, or nickel. In one embodiment, the conductive layer 216 may be made of cobalt.

Correspondingly, the present disclosure also provides a semiconductor structure. Referring to FIG. 12, the semiconductor structure may include a substrate 200. The substrate 200 may include a first region I and a second region II. The first region I may include a plurality of separated first fins 201, and the second region II may include a plurality of separated second fins 202. Each first fin 201 and each second fin 202 may be extended along a first direction X, respectively.

The semiconductor structure may also include a plurality of first gate structures 209, a plurality of second gate structures 210, a plurality of first source-drain doped layers 206, a plurality of second source-drain doped layers 207, and a first dielectric layer 208. Each first gate structure 209 may be across the first fin 201, and adjacent first gate structures 209 may be spaced apart by a first dimension d1 along the first direction X. Each second gate structure 210 may be across the second fin 202, and adjacent second gate structures 210 may be spaced apart by a second dimension d2 along the first direction X. The second dimension d2 may be smaller than the first dimension d1. The first source-drain doped layer 206 may be formed in the first fin 201 on each side of the first gate structure 209, and the second source-drain doped layer 207 may be formed in the second fin 202 on each side of the second gate structure 210. A thickness of the second source-drain doped layer 207 may be greater than a thickness of the first source-drain doped layer 206. The first dielectric layer 208 may cover the sidewall of each of the first gate structure 209 and the second gate structure 210. A top surface of a first portion of the first dielectric layer 208 disposed over the first region I may be lower than a top surface of a second portion of the first dielectric layer 208 disposed over the second region II.

In addition, the semiconductor structure may include a first barrier layer 211. The first barrier layer 211 may be disposed over the first portion of the first dielectric layer 208 disposed over the first region I. The first barrier layer 211 and the first portion of the first dielectric layer 208 disposed over the first region I may include a first opening 214. The first opening 214 may expose the first source-drain doped layer 206. The second portion of the first dielectric layer 208 disposed over the second region II may include a second opening 215. The second opening 215 may expose the second source-drain doped layer 207.

In one embodiment, the first barrier layer 211 may be formed over the first portion of the first dielectric layer 208 disposed over the first region I. Because the etching rate of the first barrier layer 211 is lower than the etching rate of the first dielectric layer 208, during the process of forming the first opening 214, a certain amount of etching time period may be consumed by the first barrier layer 211. Therefore, the time period for ultimately etching the first source-drain doped layer 206 may be reduced, such that the first source-drain doped layer 206 may be prevented from being penetrated through by the etching, and the contact resistance between a subsequently formed conductive layer and the first source-drain doped layer 206 may be prevented from increasing, thereby improving the performance of the ultimately formed semiconductor structure.

In one embodiment, the semiconductor structure may further include a second barrier layer 212 disposed over the first gate structure 209, the second gate structure 210, the first dielectric layer 208, and the first barrier layer 211, and a second dielectric layer 213 disposed over the second barrier layer 212. The first opening 214 and the second opening 215 may also be located in the second barrier layer 212 and the second dielectric layer 213. In one embodiment, the first barrier layer 211 may be made of silicon nitride. In one embodiment, the second barrier layer 212 may be made of silicon nitride.

In one embodiment, the first gate structure 209 may have a third dimension d3 along the first direction X, and the second gate structure 210 may have a fourth dimension d4 along the first direction X, where the fourth dimension d4 may be smaller than the third dimension d3.

In one embodiment, the semiconductor structure may further include a conductive layer 216 disposed in the first opening 214 and in the second opening 215. The conductive layer 216 may be made of a material including a metal, and the metal may include cobalt, rubidium, tungsten, aluminum, copper, titanium, silver, gold, lead, or nickel. In one embodiment, the conductive layer 216 may be made of cobalt.

The disclosed embodiments may have following beneficial effects. In the disclosed semiconductor structure, the first barrier layer may be formed over the first portion of the first dielectric layer disposed over the first region. Because the etching rate of the first barrier layer is lower than the etching rate of the first dielectric layer, during the process of forming the first opening, a certain amount of etching time period may be consumed by the first barrier layer. Therefore, the time period for ultimately etching the first source-drain doped layer may be reduced, such that the first source-drain doped layer may be prevented from being penetrated through by the etching, and the contact resistance between the subsequently formed conductive layer and the first source-drain doped layer may be prevented from increasing, thereby improving the performance of the ultimately formed semiconductor structure.

In the disclosed fabrication method, the first barrier layer may be formed over the first portion of the first dielectric layer disposed over the first region. Because the etching rate of the first barrier layer is lower than the etching rate of the first dielectric layer, during the process of forming the first opening, a certain amount of etching time period may be consumed by the first barrier layer. Therefore, the time period for ultimately etching the first source-drain doped layer may be reduced, such that the first source-drain doped layer may be prevented from being penetrated through by the etching, and the contact resistance between the subsequently formed conductive layer and the first source-drain doped layer may be prevented from increasing, thereby improving the performance of the ultimately formed semiconductor structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a substrate, wherein the substrate comprises a first region and a second region, the first region comprises a plurality of separated first fins, the second region comprises a plurality of separated second fins, and each first fin and each second fin are extended along a first direction, respectively;

a plurality of first gate structures, a plurality of second gate structures, a plurality of first source-drain doped layers, a plurality of second source-drain doped layers, and a first dielectric layer, wherein:
  a first gate structure of the plurality of first gate structures is across a first fin of the plurality of first fins, and adjacent first gate structures of the plurality of first gate structures are spaced apart by a first dimension along the first direction,
  a second gate structure of the plurality of second gate structures is across a second fin of the plurality of second fins, and adjacent second gate structures of the plurality of second gate structures are spaced apart by a second dimension along the first direction, wherein the second dimension is smaller than the first dimension,
  a first source-drain doped layer of the plurality of first source-drain doped layers is located in the first fin on each side of the first gate structure, and a second source-drain doped layer of the plurality of second source-drain doped layers is located in the second fin on each side of the second gate structure, wherein a thickness of the second source-drain doped layer is greater than a thickness of the first source-drain doped layer, and
  the first dielectric layer covers a sidewall of each of the first gate structure and the second gate structure, and a top surface of a first portion of the first dielectric layer disposed over the first region is lower than a top surface of a second portion of the first dielectric layer disposed over the second region; and
a first barrier layer, disposed over the first portion of the first dielectric layer disposed over the first region, wherein:
  the first barrier layer and the first portion of the first dielectric layer disposed over the first region comprise a first opening, and the first opening exposes the first source-drain doped layer, and
  the second portion of the first dielectric layer disposed over the second region comprises a second opening, and the second opening exposes the second source-drain doped layer.

2. The semiconductor structure according to claim 1, further comprising:
  a second barrier layer, disposed over the first gate structure, the second gate structure, the first dielectric layer, and the first barrier layer, and
  a second dielectric layer, disposed over the second barrier layer, wherein the first opening and the second opening are further located in the second barrier layer and in the second dielectric layer.

3. The semiconductor structure according to claim 2, wherein:
  the first barrier layer is made of a material comprising silicon nitride, and
  the second barrier layer is made of a material comprising silicon nitride.

4. The semiconductor structure according to claim 1, wherein:
  the first gate structure has a third dimension along the first direction, and the second gate structure has a fourth dimension along the first direction, wherein the fourth dimension is smaller than the third dimension.

5. The semiconductor structure according to claim 1, further comprising:
  a conductive layer disposed in each of the first opening and the second opening.

6. The semiconductor structure according to claim 5, wherein:
  the conductive layer is made of a material comprising a metal, and the metal comprises cobalt, rubidium, tungsten, aluminum, copper, titanium, silver, gold, lead, or nickel.

7. A fabrication method of a semiconductor structure, comprising:
  providing a substrate, wherein the substrate comprises a first region and a second region, the first region comprises a plurality of separated first fins, the second region comprises a plurality of separated second fins, and each first fin and each second fin are extended along a first direction, respectively;
  forming a plurality of first gate structures, a plurality of second gate structures, a plurality of first source-drain doped layers, a plurality of second source-drain doped layers, and a first dielectric layer, wherein:
    a first gate structure of the plurality of first gate structures is across a first fin of the plurality of first fins, and adjacent first gate structures of the plurality of first gate structures are spaced apart by a first dimension along the first direction,
    a second gate structure of the plurality of second gate structures is across a second fin of the plurality of second fins, and adjacent second gate structures of the plurality of second gate structures are spaced apart by a second dimension along the first direction, wherein the second dimension is smaller than the first dimension,
    a first source-drain doped layer of the plurality of first source-drain doped layers is located in the first fin on each side of the first gate structure, and a second source-drain doped layer of the plurality of second source-drain doped layers is located in the second fin on each side of the second gate structure, wherein a thickness of the second source-drain doped layer is greater than a thickness of the first source-drain doped layer, and
    the first dielectric layer covers a sidewall of each of the first gate structure and the second gate structure, and a top surface of a first portion of the first dielectric layer disposed over the first region is lower than a top surface of a second portion of the first dielectric layer disposed over the second region;
  forming a first barrier layer on a surface of the first portion of the first dielectric layer disposed over the first region; and
  forming a first opening in the first barrier layer and in the first portion of the first dielectric layer disposed over the first region by removing a portion of the first barrier layer and a portion of the first portion of the first dielectric layer through etching, and forming a second opening in the second portion of the first dielectric layer disposed over the second region by removing a portion of the second portion of the first dielectric layer through etching, wherein:
    the first opening exposes the first source-drain doped layer,
    the second opening exposes the second source-drain doped layer, and
    an etching rate of the first barrier layer is less than an etching rate of the first dielectric layer.

8. The method according to claim 7, before forming the plurality of first gate structures and the plurality of second gate structures, further comprising:

forming a plurality of first dummy gate structures over the first region, wherein a first dummy gate structure of the plurality of first dummy gate structures is across the first fin; and forming a plurality of second dummy gate structures over the second region, wherein a second dummy gate structure of the plurality of second dummy gate structures is across the second fin, and the first dielectric layer covers a sidewall of each of the first dummy gate structure and the second dummy gate structure.

9. The method according to claim 8, wherein forming the plurality of first source-drain doped layers and the plurality of second source-drain doped layers comprises:

forming a plurality of first source-drain openings in the first fin by etching the first fin using the plurality of first dummy gate structures as a mask;

forming a plurality of second source-drain openings in the second fin by etching the second fin using the plurality of second dummy gate structures as a mask;

simultaneously forming an epitaxial layer in each first source-drain opening and each second source-drain opening using an epitaxial growth process until the epitaxial layer fully fills a second source-drain opening of the plurality of second source-drain openings; and in-situ doping the epitaxial layer during the epitaxial growth process, to dope source-drain ions in the epitaxial layer, to form the first source-drain doped layer and the second source-drain doped layer.

10. The method according to claim 8, wherein forming the plurality of first gate structures and the plurality of second gate structures comprises:

removing the first dummy gate structure to form a first gate opening in the first dielectric layer, removing the second dummy gate structure to form a second gate opening in the first dielectric layer, forming the first gate structure in the first gate opening, and forming the second gate structure in the second gate opening.

11. The method according to claim 10, wherein forming the first gate structure in the first gate opening and forming the second gate structure in the second gate opening comprise:

forming a gate material layer in the first gate opening, in the second gate opening, and on a top surface of the first dielectric layer; and performing a planarization treatment on the gate material layer and the first dielectric layer, to form the first gate structure and the second gate structure.

12. The method according to claim 11, wherein:
the planarization treatment comprises a chemical mechanical polishing process.

13. The method according to claim 12, wherein the chemical mechanical polishing process comprises:

performing a first chemical mechanical polishing process on the gate material layer until the top surface of the first dielectric layer is exposed, wherein a polishing rate of the first chemical mechanical polishing process on the gate material layer is greater than a polishing rate of the first chemical mechanical polishing process on the first dielectric layer; and after performing the first chemical mechanical polishing process, performing a second chemical mechanical polishing process on the gate material layer and the first dielectric layer until each of the first gate structure and the second gate structure has a preset height, wherein a polishing rate of the second chemical mechanical polishing process on the first dielectric layer is greater than a polishing rate of the second chemical mechanical polishing process on the gate material layer.

14. The method according to claim 13, wherein:
a ratio of the polishing rate of the first chemical mechanical polishing process on the gate material layer over the polishing rate of the first chemical mechanical polishing process on the first dielectric layer is greater than 10:1, and a ratio of the polishing rate of the second chemical mechanical polishing process on the first dielectric layer over the polishing rate of the second chemical mechanical polishing process on the gate material layer is greater than 1:1 and less than or equal to 10:1.

15. The method according to claim 7, wherein:
during the process of forming the first barrier layer on the surface of the first portion of the first dielectric layer disposed over the first region, the first barrier layer is further formed on a surface of the second portion of the first dielectric layer disposed over the second region, wherein a thickness of the first barrier layer disposed over the first region is greater than a thickness of the first barrier layer disposed over the second region.

16. The method according to claim 7, after forming the first barrier layer, further comprising:

forming a second barrier layer over the first gate structure, the second gate structure, the first dielectric layer, and the first barrier layer, and forming a second dielectric layer over the second barrier layer, wherein the first opening and the second opening are further located in the second barrier layer and in the second dielectric layer.

17. The method according to claim 16, wherein:
the first barrier layer is made of a material comprising silicon nitride, and the second barrier layer is made of a material comprising silicon nitride.

18. The method according to claim 7, wherein:
the first gate structure has a third dimension along the first direction, and the second gate structure has a fourth dimension along the first direction, wherein the fourth dimension is smaller than the third dimension.

19. The method according to claim 7, after forming the first opening and the second opening, further comprising:

forming a conductive layer in each of the first opening and the second opening.

20. The method according to claim 19, wherein:
the conductive layer is made of a material comprising a metal, and the metal comprises cobalt, rubidium, tungsten, aluminum, copper, titanium, silver, gold, lead, or nickel.

* * * * *